(12) United States Patent
Steinecke et al.

(10) Patent No.: US 6,798,303 B2
(45) Date of Patent: Sep. 28, 2004

(54) CLOCK SIGNAL GENERATING DEVICE

(75) Inventors: Thomas Steinecke, Wörth (DE); Dirk Hesidenz, Taufkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/356,922

(22) Filed: Jan. 30, 2003

(65) Prior Publication Data

US 2003/0141937 A1 Jul. 31, 2003

(30) Foreign Application Priority Data

Jan. 30, 2002 (EP) .......................................... 02002307

(51) Int. Cl.[7] .............................................. H03B 29/00
(52) U.S. Cl. ............................. 331/78; 331/18; 327/8; 327/153; 327/158; 327/159; 375/200
(58) Field of Search .......................... 331/78, 18, 1 A; 375/200, 376; 327/8, 159, 153, 158, 164

(56) References Cited

U.S. PATENT DOCUMENTS 5,491,458 A * 2/1996 McCune, Jr. et al. ....... 332/144
6,160,456 A    12/2000 Chang ......................... 329/307

FOREIGN PATENT DOCUMENTS

| EP | 0 319 851 A1 | 6/1989 |
| EP | 0 655 829 A1 | 5/1995 |
| EP | 0 739 089 A2 | 10/1996 |
| JP | 2000101424 | 4/2000 |
| WO | 00/21237 | 4/2000 |

OTHER PUBLICATIONS

Hardin, K. B. et al.: "A Study of the Interference Potential of Spread Spectrum Clock Generation Techniques", Institute of Electrical and Electronics Engineers, Aug. 14–18, 1995, 7 pp.
Hardin, K. B. et al.: "Design Considerations of Phase–Locked Loop Systems for Spread Spectrum Clock Generation Compatibility", Institute of Electrical and Electronics Engineers, Aug. 18–22, 1997, 10 pp.
Hardin, K. B. et al.: "Spread Spectrum Clock Generation for the Reduction of Radiated Emissions", Institute of Electrical and Electronics Engineers, Aug. 22–26, 1994, 6 pp.

* cited by examiner

Primary Examiner—Arnold Kinkead
(74) Attorney, Agent, or Firm—Laurence A. Greenberg; Werner H. Stemer; Ralph E. Locher

(57) ABSTRACT

A clock signal generating device is described, having an oscillator and a PLL connected downstream thereof. The clock signal generating device is distinguished by the fact that a phase shifting device is provided between the oscillator and the PLL. This phase shifting device can temporally shift the edges of the signal output by the oscillator to a variable extent, and feeds the resultant signal to the PLL as an input signal. Such a clock signal generating device makes it possible to realize a spread spectrum oscillator which is constructed in a simple manner and can be made small.

13 Claims, 3 Drawing Sheets

CLOCK SIGNAL GENERATING DEVICE

BACKGROUND OF THE INVENTION

FIELD OF THE INVENTION

The present invention relates to a clock signal generating device having an oscillator and a PLL connected downstream thereof.

Such a clock signal generating device is illustrated in FIG. 1. In this case, the oscillator is designated by the reference symbol OSC, and the PLL (phase-locked loop) is designated by the reference symbol PLL. The PLL contains a phase detector or phase comparator PD, a loop filter LF, a voltage-controlled oscillator VCO and a frequency divider DIV, which are connected in the manner shown in FIG. 1.

A PLL generally serves for generating a clock signal having a frequency that differs from the frequency of the signal output by the oscillator OSC, and more precisely, for generating a clock signal having a frequency that is greater than the frequency of the signal output by the oscillator OSC by a specific factor.

The clock signal output by the PLL is generated by the voltage-controlled oscillator VCO. In other words, the output signal of the voltage-controlled oscillator VCO is at the same time the output signal of the configuration shown in FIG. 1. The output signal of the voltage-controlled oscillator VCO is furthermore fed to the frequency divider DIV. The frequency divider DIV generates a signal whose frequency is a specific factor less than the frequency of the signal fed to it. The factor is chosen such that, when the frequency of the signal generated by the voltage-controlled oscillator VCO is the desired frequency sought, the frequency of the output signal of the frequency divider DIV corresponds precisely to the frequency of the signal output by the oscillator OSC. The output signal of the frequency divider DIV is fed to the phase comparator PD. In addition, the signal output by the oscillator OSC is fed to the phase comparator PD. The phase comparator PD compares the phases, more precisely the position of the edges of the signals fed to it, and outputs signals charge and discharge, which depend on the phase difference. These signals are fed to the loop filter LF, which converts them into a drive signal for the voltage-controlled oscillator VCO. The conversion is effected in such a way that the voltage-controlled oscillator VCO is caused to maintain its instantaneous frequency if the phase difference is equal to zero, and to alter the frequency if the phase difference is not equal to zero.

If the phase difference is equal to zero, the PLL is said to be locked on. The PLL runs stably from then on since deviations between the frequency of the signal output by the voltage-controlled oscillator VCO and the desired frequency are immediately corrected on account of the resultant relative phase shift between the signals fed to the phase comparator.

Although the frequency of the clock signal generated by the configuration shown in FIG. 1 is generally always precisely the desired frequency, the use of this clock signal can lead to problems in practice. This is because the electrical circuits which operate using such a clock signal generate huge electromagnetic emissions. It is particularly undesirable that particularly strong emissions are produced in this case at a few frequencies. The frequency spectra of the electromagnetic emissions clearly discernibly show the clock harmonics as main interference frequencies.

Although electromagnetic emissions can never be entirely prevented, it would be more favorable in many cases if the interference were at least distributed somewhat more uniformly over a larger frequency range.

This can be achieved for example by varying the frequency of the clock signal generated by the clock signal generating device, that is to say by generating a frequency-modulated clock signal.

The effects that can thereby be achieved are illustrated in FIG. 2.

FIG. 2 illustrates, on the left-hand side, the profile of different clock signals and, in each case on the right beside the latter, the frequency spectrum of the relevant clock signal.

The conditions for five different clock signals are illustrated, to be precise:

right at the top for a clock signal with a constant frequency f1;

below that for a clock signal with a constant frequency f2;

below that for a clock signal with a constant frequency f3;

below that for a clock signal with a constant frequency f4; and right at the bottom for a clock signal with a frequency that varies between f1 and f4.

As can be seen from the designation of the last-mentioned clock signal, i.e. the clock signal with a varying frequency, the clock signal is composed of periods or period parts of the clock signals with the constant frequencies f1 to f4, that is to say, it is the result of a staircase-type modulation.

As can be seen from the illustration of the frequency spectra in FIG. 2, the frequency spectrum of the clock signal with a varying frequency has the smallest maximum value. This maximum value is illustrated by a reference line B. The maximum values of the frequency spectra for the clock signals with a constant frequency f1 and f2 and f3 and f4, respectively, are considerably greater by comparison therewith. Although extreme values occur at a larger number of frequencies in the case of the clock signal with a varying frequency, a distribution of the energy between a plurality of frequencies or a larger frequency range can generally be tolerated without difficulty. For the sake of completeness, it should be noted in this connection that the energy for a continuous modulation signal is distributed over a frequency range that is proportional to the modulation swing.

The effects and possibilities for generating a clock signal with a varying frequency that can be obtained through a clock signal with a varying frequency are known, for example, from the following documents:

[1] EP 0 655 829 A1;
[2] EP 0 739 089 A2;
[3] WO 00/21237 A1;
[4] Keith B. Hardin et al: Spread Spectrum Clock Generation for the Reduction of Radiated Emissions, 1994 IEEE International Symposium On Electromagnetic Compatibility;
[5] Keith B. Hardin et al: A Study of the Interference Potential of Spread Spectrum Clock Generation Techniques, 1995 IEEE International Symposium On Electromagnetic Compatibility; and
[6] Keith B. Hardin et al: Design Considerations of Phase-Locked Loop Systems for Spread Spectrum Clock Generation Compatibility, 1997 IEEE International Symposium On Electromagnetic Compatibility.

Using clock signals with a varying frequency is designated by the technical term "spread spectrum clocking". Clock signal generating devices which generate clock signals with a varying frequency are designated by the technical term "spread spectrum oscillators".

Spread spectrum oscillators are already known. A known spread spectrum oscillator is shown in FIG. 3.

The spread spectrum oscillator shown in FIG. 3 contains an oscillator OSC, a phase-locked loop PLL, a counter CNT, a memory device MEM, formed for example, by a ROM, a D/A converter DAC, a summation element SUM, and a second voltage-controlled oscillator VCO2.

The oscillator OSC and the phase-locked loop PLL are the oscillator OSC and the phase-locked loop PLL of the clock signal generating device shown in FIG. 1. With regard to further details in respect thereof, reference is made to the explanations with reference to FIG. 1.

The counter CNT receives, as an input signal, the clock signal output by the oscillator OSC and outputs the count to the memory MEM. The memory MEM uses the count output by the counter CNT as an address and outputs the data stored under this address to the D/A converter DAC. The D/A converter subjects the data fed to it to a D/A conversion and outputs the result of this D/A conversion to the summation element SUM. Furthermore, the output signal of the loop filter LF of the phase-locked loop PLL is also fed to the summation element SUM. The summation element sums the signals fed to it and outputs the resultant signal as a control signal to the second voltage-controlled oscillator VCO2.

The clock signal generated by the spread spectrum oscillator shown in FIG. 3 is the clock signal output by the second voltage-controlled oscillator VCO2. This second voltage-controlled oscillator VCO2 has the same fundamental frequency as the voltage-controlled oscillator VCO of the PLL, and like the latter, is also driven using the output signal of the loop filter LF. Furthermore, the control voltage controlling the second voltage-controlled oscillator VCO2 also depends, however, on an offset formed by the counter CNT, the memory device MEM, and the D/A converter DAC; the control voltage controlling the second voltage-controlled oscillator VCO2 is the output signal of the summation element SUM. The summation of the offset with respect to the output signal of the loop filter LF has the consequence that the clock signal output by the second voltage-controlled oscillator VCO2 is detuned in a targeted manner relative to the clock signal output by the voltage-controlled oscillator VCO.

More precisely, the offset effects the outputting of a frequency-modulated signal from the second voltage-controlled oscillator VCO2, both the modulation frequency and the modulation swing being predetermined by the offset.

The modulation frequency is determined by the counter CNT. As has already been mentioned above, the counter CNT addresses the memory MEM in which the modulation curve shape is stored in discrete form.

The modulation swing can be determined both by the choice of the range of values in the memory MEM and by the signal swing of the digital-to-analog converter DAC. Realistic values lie between 0.1% and 1% of the system clock.

The determination of the optimum modulation curve shape is described in [4].

The spread spectrum oscillator described has the disadvantage that it is relatively complicated to realize, and that a relatively large amount of area is required for the practical realization in an integrated circuit, so that an integrated circuit containing such a spread spectrum oscillator becomes large and expensive.

SUMMARY OF THE INVENTION

It is accordingly an object of the invention to provide a clock signal generating device which overcomes the above-mentioned disadvantages of the prior art apparatus of this general type.

In particular, it is an object of the invention to provide a spread spectrum oscillator that can be realized simpler and smaller.

The inventive clock signal generating device is distinguished by the fact that a phase shifting device is provided between the oscillator and the phase-locked loop PLL. This phase shifting device can temporally shift the edges of the signal output by the oscillator to a variable extent, and feeds the resultant signal to the phase-locked loop PLL as an input signal.

Since the inventive clock signal generating device does not contain a second voltage-controlled oscillator, but rather "only" a phase shifting device with a controllable phase shift, it can be realized simpler and smaller than conventional spread spectrum oscillators.

With the foregoing and other objects in view there is provided, in accordance with the invention, a clock signal generating device including: an oscillator for outputting a signal having edges; a phase-locked loop connected downstream from the oscillator; and a phase shifting device for obtaining a resultant signal by temporally variably shifting the edges of the signal output by the oscillator. The phase shifting device is configured for feeding the resultant signal to the phase-locked loop as an input signal. The phase shifting device is connected between the oscillator and the phase-locked loop.

In accordance with an added feature of the invention, the phase shifting device is a delay element with an adjustable delay.

In accordance with an additional feature of the invention, the phase shifting device is a voltage-controlled delay element.

In accordance with another feature of the invention, a memory device is provided for storing control signals used to drive the phase shifting device.

In accordance with a further feature of the invention, the memory device is a nonvolatile memory device.

In accordance with a further added feature of the invention, a frequency divider provides an output signal that is obtained by dividing a frequency of the signal output by the oscillator. An address generating device is also provided for addressing the memory device. The address generating device is for generating an address used while taking account of the output signal of the frequency divider.

In accordance with a further additional feature of the invention, a D/A converter is provided for converting a control signal output by the memory device into an analog control signal being fed to the phase shifting device.

In accordance with yet an added feature of the invention, the phase shifting device is driven such that the phase-locked loop generates a clock signal with a varying frequency.

In accordance with yet another feature of the invention, the phase shifting device is driven such that the clock signal generating device can be used as a spread spectrum oscillator.

In accordance with yet a further feature of the invention, the phase shifting device is driven to shift the edges of the signal output by the oscillator such that the phase shifting device outputs a clock signal with a frequency that is different than that of the signal output by the oscillator.

Other features which are considered as characteristic for the invention are set forth in the appended claims.

Although the invention is illustrated and described herein as embodied in a clock signal generating device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The clock signal generating device described below is, with the exception of the oscillator, part of a program-controlled unit such as, for example, a microprocessor, a microcontroller or a signal processor. However, is pointed out at this juncture that the clock signal generating device described may also be part of any other arbitrary module, and may also be a dedicated module without any further components. The clock signal generating device may also be constructed as a discrete circuit.

The clock signal generating device can supply both the program-controlled unit containing it and other system components with the clock signal that it generates. The program-controlled unit preferably contains an output terminal via which the clock signal generated by the clock signal generating device can be output from the program-controlled unit.

Figure 4:
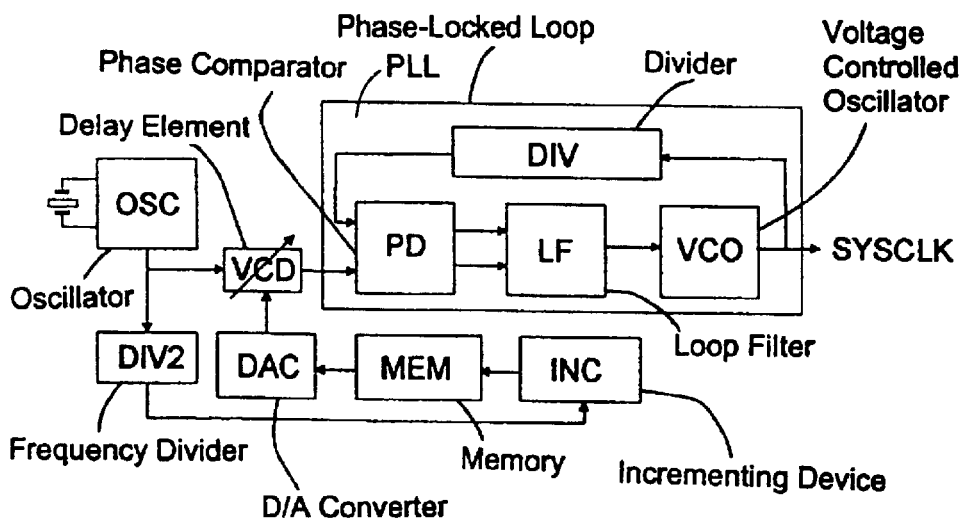
FIG. 4 is a block diagram of an inventive clock signal generating device.

Referring now to the figures of the drawing in detail and first, particularly, to FIG. 4 thereof, there is shown a basic simplified form of a clock signal generating device constructed as a spread spectrum oscillator.

The clock signal generating device shown in FIG. 4 contains an oscillator OSC, a phase-locked loop PLL, a phase shifting device with a controllable phase shift, which is formed by a voltage-controlled delay element VCD in the example considered, a second frequency divider DIV2, an incrementing device INC, a memory MEM, preferably formed by a nonvolatile memory such as a ROM, for example, and a D/A converter DAC.

Figure 1:
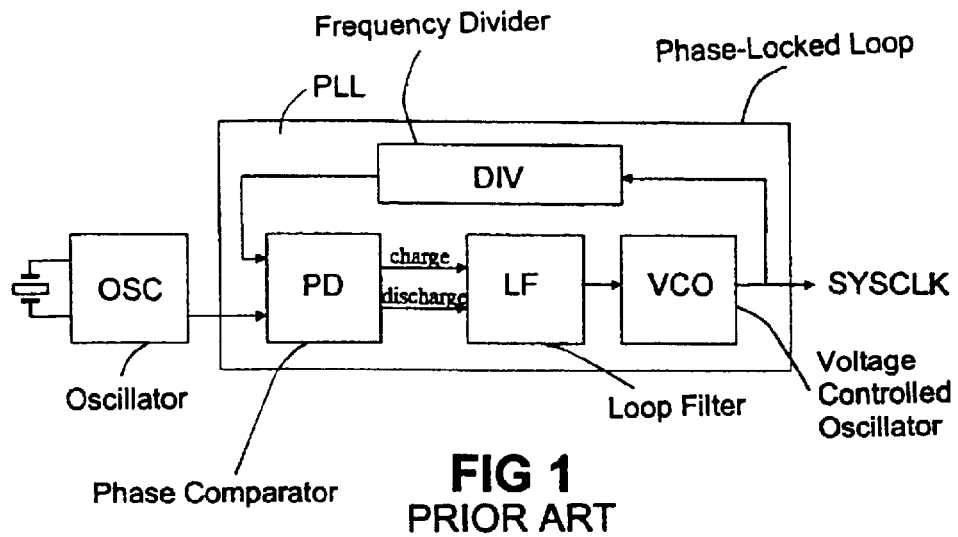
FIG. 1 is a block diagram of a conventional clock signal generating device for generating a clock signal with a constant frequency.
Figure 2:
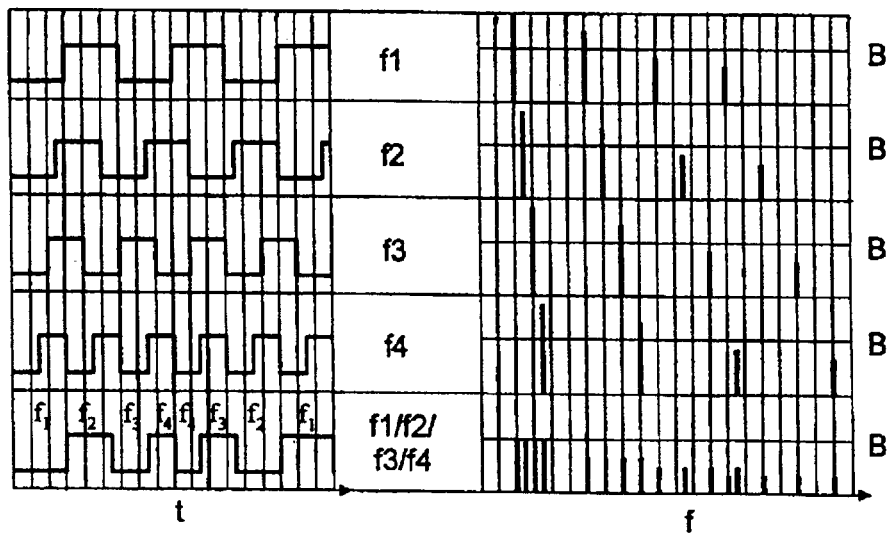
FIG. 2 is a graph showing the temporal profile and the frequency spectrum of different clock signals.

The oscillator OSC and the phase-locked loop PLL are the oscillator OSC and the phase-locked loop PLL of the clock signal generating device shown in FIG. 1 or components corresponding thereto. With regard to further details thereof, reference is made to the explanations given with reference to FIG. 1.

Figure 3:
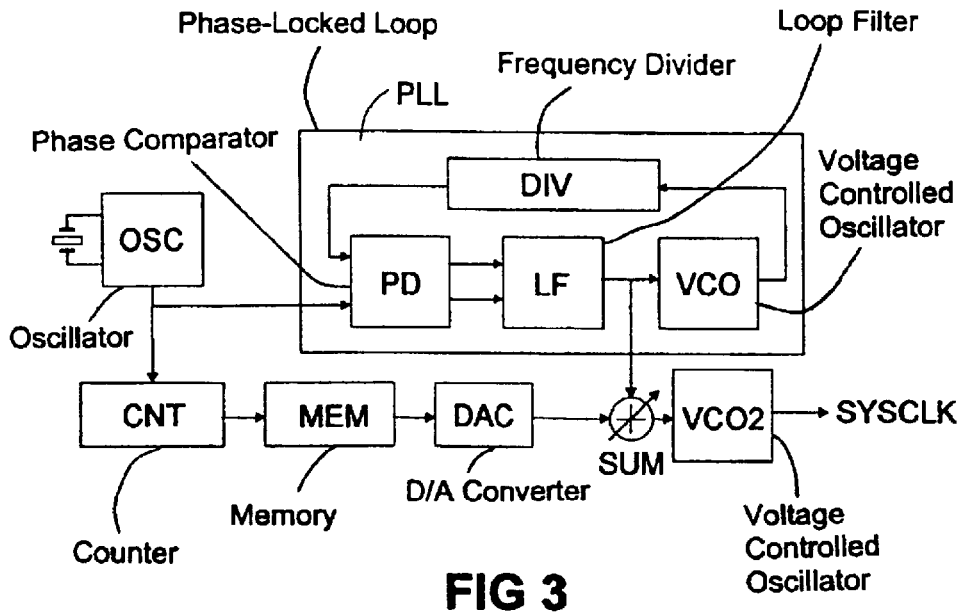
FIG. 3 is a block diagram of a conventional clock signal generating device for generating a clock signal with a varying frequency.

The voltage-controlled delay element VCD is configured between the oscillator OSC and the phase-locked loop PLL. In other words, unlike in the case of the clock signal generating devices shown in FIGS. 1 and 3, the clock signal generated by the oscillator OSC is not fed to the phase-locked loop PLL directly, but rather via the voltage-controlled delay element VCD. The voltage-controlled delay element VCD is controlled by the output signal of the D/A converter DAC. The signal output by the D/A converter DAC is the result of the D/A conversion of data output by the memory MEM. The memory MEM is addressed by the output signal of the incrementer INC acting as an address generating device. The incrementer INC is driven by the output signal of the second frequency divider DIV2. The second frequency divider DIV2 receives, as an input signal, the clock signal output by the oscillator OSC and generates therefrom a clock signal whose frequency is a specific factor less than the frequency of the output signal of the oscillator OSC.

In the memory MEM, there are stored in digital form the control signals that have to be used to drive the voltage-controlled delay element VCD in order to delay the signal fed thereto as desired, more precisely the edges of the signal. The second frequency divider DIV2 and the incrementing device INC ensure that the memory MEM outputs, at the desired point in time, the control signal that has to be used to drive the voltage-controlled delay element VCD so that it carries out the respective desired delay.

The voltage-controlled delay element VCD is driven in such a way that the signal which it outputs and which is fed to the phase-locked loop PLL causes the phase-locked loop PLL to generate a clock signal with a varying frequency. This is done by virtue of the fact that the voltage-controlled delay element VCD delays the rising and falling edges of the clock signal output by the oscillator OSC in such a way that a clock signal whose frequency apparently varies is fed to the PLL. The frequency of the clock signal output by the voltage-controlled delay element VCD does not vary in reality, however. A frequency variation is only simulated to the PLL by using a skillful phase shift in the clock signal fed to it from the voltage-controlled delay element. It is not necessary to feed a clock signal with a varying frequency to the PLL in order to cause the PLL to output a clock signal with a varying frequency, because, after all, the frequency of the clock signal SYSCLK output by the PLL is not readjusted in a manner dependent on the frequency difference, but rather in a manner dependent on the phase difference between the signals fed to the phase comparator PD.

In the example considered, the voltage-controlled delay element VCD delays each edge of the clock signal output by the oscillator OSC by a certain time to a greater or lesser extent than the preceding edge. In this case, it must be taken into account that a clock edge of the clock signal output by the oscillator is not permitted to be delayed to such an extent that it is overtaken by the clock edge of the output signal of the voltage-controlled oscillator VCO which is fed back to the phase detector PD. Normally, the maximum permissible time difference between an edge of the clock signal output by the oscillator and the signal output by the voltage-controlled oscillator VCO is equal to approximately one clock period. If only one clock edge (rising or falling) is delayed by the voltage-controlled delay element VCD, the permissible time difference is reduced to half a clock period.

The voltage-controlled delay element VCD can also generate, for a certain (short) time, a clock signal whose frequency is actually (not just apparently) greater or less than the frequency of the oscillator signal fed to it by a specific amount in a constant manner. Before a more detailed explanation is given of the necessary procedure in order that the voltage-controlled delay element VCD outputs a clock signal with a varying frequency, first this simpler case is explained with reference to FIG. 5.

Figure 5:
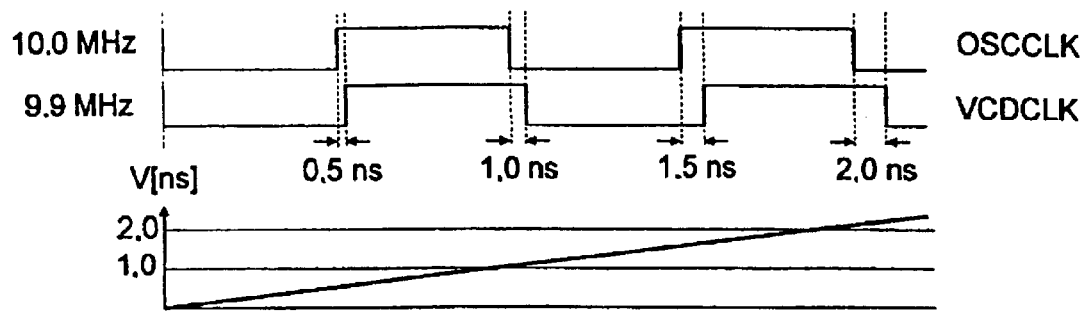
FIG. 5 is a graph illustrating the phase shift that has to be carried out by the phase shifting device of the clock signal generating device shown in FIG. 4 in order to generate a clock signal with a frequency that is reduced in a constant manner relative to the clock signal fed to it.

FIG. 5 illustrates by way of example how the edges of an oscillator signal having a frequency of 10 MHz are to be delayed by the voltage-controlled delay element VCD so that the voltage-controlled delay element VCD outputs a signal with a constant frequency of 9.9 MHz.

The oscillator signal OSCCLK is represented in the topmost representation. The clock signal VCDCLK output by the voltage-controlled delay element VCD is represented below that, and right at the bottom the illustration depicts the profile of the delay V with which the voltage-controlled delay element VCD in each case has to delay the edges occurring in the oscillator signal.

As can be seen from FIG. 5, the first rising edge of the oscillator signal is delayed by 0.5 ns, the subsequent falling edge is delayed by 0.5 ns more, that is to say by 1.0 ns, the subsequent rising edge is again delayed by 0.5 ns more, that is to say by 1.5 ns, and the subsequent falling edge is again delayed by 0.5 ns more, that is to say by 2.0 ns, etc.

Thus, each clock period is 1 ns shorter than the respective preceding clock period. Since the period duration of a signal with a frequency of 10 MHz is 100 ns, the clock edges of the oscillator signal and of the clock signal generated by the voltage-controlled delay element VCD coincide after 100 clock periods. The phase relationship is then no longer correct and the voltage-controlled delay element VCD supplies an incorrect item of information at the output.

In the case of a spread spectrum oscillator, the voltage-controlled delay element VCD—unlike in the case of the example illustrated in FIG. 5—must not generate a clock signal whose frequency permanently deviates from the frequency of the oscillator signal by a specific constant amount, but rather a clock signal whose frequency varies, more precisely drifts around the frequency of the oscillator signal.

Figure 6:
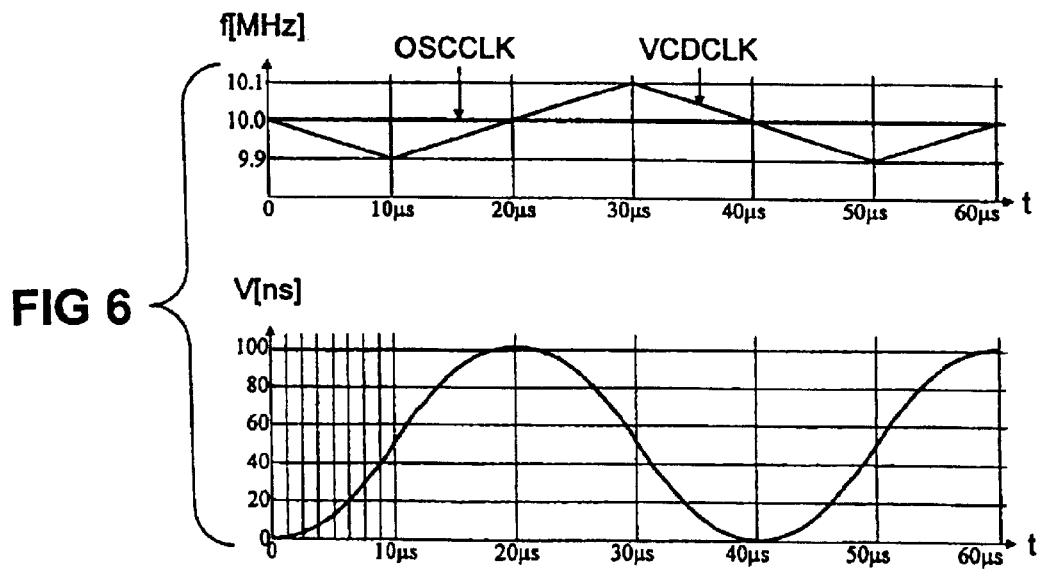
FIG. 6 is a graph illustrating the phase shift that has to be carried out by the phase shifting device so that the clock signal generating device generates a clock signal with a varying frequency.

One example of this is illustrated in FIG. 6.

The example shown in FIG. 6 illustrates a triangular-waveform frequency modulation of the oscillator signal OSCCLK, whose frequency may again be 10 MHz. In the example considered, the modulation swing is 100 kHz, as a result of which the frequency of the clock signal VCDCLK generated by the voltage-controlled delay element VCD swings between 9.9 MHz and 10.1 MHz. The modulation frequency was chosen as 25 kHz, which corresponds to a period duration of 40 $\mu$s. Consequently, the frequency of the clock signal generated by the voltage-controlled delay element VCD must fall from 10.0 MHz to 9.9 MHz within 10 $\mu$s, then rise again from 9.9 MHz to 10.1 MHz within 20 $\mu$s, then fall again from 10.1 MHz to 9.9 MHz in another 20 $\mu$s, and so on. The temporal profile of the frequency of this clock signal is illustrated in the upper diagram of FIG. 6.

The times by which the voltage-controlled delay element VCD must delay the edges of the oscillator signal result from the following consideration: 10 $\mu$s contains 100 clock periods of the 10 MHz oscillator clock.

In order to achieve a linear frequency decrease of 100 kHz within 10 $\mu$s, a delay which is equal to the sum of the last added delay plus 10 ps must be added to the last used delay time in each case per clock period (100 ns). Consequently, the required total delay of the voltage-controlled delay element VCD is:

after 100 ns: 10 ps;

after 200 ns: 30 ps;

after 300 ns: 60 ps;

after 400 ns: 100 ps;

and so on.

The temporal profile of the delay time VCD by which the voltage-controlled delay element must delay the edges occurring in the oscillator signal in order to achieve the frequency profile shown in the upper diagram of FIG. 6 is illustrated in the lower diagram of FIG. 6.

Generally, the following holds true for the delay td that is to be set in absolute fashion after n clock periods given a period change $\Delta P$, where $\Delta P$ is the difference in the period duration between the oscillator frequency $f_{osc}$ and the maximum frequency of the signal output by the voltage-controlled delay element (oscillator frequency $f_{osc}$ plus frequency swing $f_{swing}$):

$$\Delta P = \frac{1}{f_{osc}} - \frac{1}{f_{osc} - f_{swing}}$$

$$t_d = \Delta P \cdot \sum_1^n n = \frac{n \cdot (n+1)}{2} \cdot \Delta P$$

The following thus results for the example shown in FIG. 6 ($f_{osc}$=10.0 MHz; $f_{swing}$=100 kHz; n=100):

$\Delta P$=10 ps; $t_d$=50.5 ns.

After the reversal point at t=10 $\mu$s, the delay that is to be added per clock period (100 ns) has to progressively decrease again in order that the resulting frequency increases. On account of the symmetry of the modulation curve, the delay per clock period has to be reduced by 10 ps plus the previous reduction, that is to say progressively 10 ps, 20 ps, 30 ps and so on. The additional delay that is to be set in absolute fashion in the VCD thus decreases by 10 ps, 30 ps, 60 ps, 100 ps and so on per clock period (100 ns). Nevertheless, the total delay of the VCD becomes ever greater, although by a decreasing amount from clock period to clock period. Thus, the value zero for the delay to be added is reached after a further 10 $\mu$s. Afterward, the delay is actually reduced again.

Expressed mathematically, a constant frequency deviation is achieved by the summation of the difference between the period durations of starting and target frequencies. A continuous frequency change requires the additional integration of the respective period duration differences between previous and present periods.

The changes and absolute values of the delay times to be set per clock period in the voltage-controlled delay element VCD which are listed in the table below result for the case shown in FIG. 6. The table covers a complete period of the modulation signal, which, with a duration of 40 $\mu$s, encompasses exactly 400 clock periods of the oscillator signal. The maximum value to be set for the delay time is 101 ns. In this case, it must be taken into account that this calculation was established for an open-loop control, but not for a closed-loop control in the sense of a PLL. By virtue of the feedback within the PLL, a compensation of the edge delay is sought which ultimately leads to a reduction of the delay time that is actually to be set in the VCD. This effect was confirmed by analog simulations of the complete circuit.

| Time [µs] | Oscillator signal period No. | $t_d$ change [ps] | $t_d$ absolute [ps] | resulting frequency [MHz] |
|---|---|---|---|---|
| 0 | 0 | 0 | 0 | 10.000 |
| 0.1 | 1 | 10 | 10 | 9.999 |
| 0.2 | 2 | 20 | 30 | 9.998 |
| 0.3 | 3 | 30 | 60 | 9.997 |
| ... | | | | |
| 9.8 | 98 | 980 | 48530 | 9.902 |
| 9.9 | 99 | 990 | 49510 | 9.901 |
| 10.0 | 100 | 1000 | 50500 | 9.900 |
| 10.1 | 101 | 990 | 51490 | 9.901 |
| 10.2 | 102 | 980 | 52470 | 9.902 |
| ... | | | | |
| 19.8 | 198 | 20 | 100970 | 9.998 |
| 19.9 | 199 | 10 | 100990 | 9.999 |
| 20.0 | 200 | 0 | 101000 | 10.000 |
| 20.1 | 201 | −10 | 100990 | 10.001 |
| 20.2 | 202 | −20 | 100970 | 10.002 |
| ... | | | | |
| 29.8 | 298 | −980 | 52470 | 10.098 |
| 29.9 | 299 | −990 | 51490 | 10.099 |
| 30.0 | 300 | −1000 | 50500 | 10.100 |
| 30.1 | 301 | −990 | 49510 | 10.099 |
| 30.2 | 302 | −980 | 48530 | 10.098 |
| ... | | | | |
| 39.8 | 398 | −20 | 30 | 10.002 |
| 39.9 | 399 | −10 | 10 | 10.001 |
| 40.0 | 400 | 0 | 0 | 10.000 |
| 40.1 | 401 | 10 | 10 | 9.999 |
| 40.2 | 402 | 20 | 30 | 9.998 |
| ... | | | | |

For the sake of completeness, it should be noted that the phase shifting device which is formed by a voltage-controlled delay element in the example considered need not necessarily be formed by a delay element, indeed not necessarily by a voltage-controlled delay element. What is important, however, is that a phase shifting device with a controllable phase shift is involved.

It should be apparent and needs no further explanation that the clock signal generating device described above can also generate signals or signal profiles other than the signals or signal profiles described by way of example above. In particular, there is no restriction:
- that the frequency of the oscillator signal must be 10 MHz;
- that a triangular-waveform modulation is carried out;
- that the modulation swing is 100 kHz; and
- that the modulation frequency is 25 kHz.

In principle, all of the parameters can also be chosen differently as desired.

Independently of the details of the practical realization, the clock signal generating device described can be realized simpler and smaller than is the case with conventional clock signal generating devices that can be used as spread spectrum oscillators. In particular, a controllable phase shifting device can be realized considerably simpler and smaller than an additional voltage-controlled oscillator.

We claim:

1. A clock signal generating device, comprising:
   an oscillator for outputting a signal having edges;
   a phase-locked loop connected downstream from said oscillator;
   a phase shifting device for obtaining a resultant signal by temporally variably shifting the edges of the signal output by said oscillator;
   said phase shifting device configured for feeding the resultant signal in simulated frequency variation form to said phase-locked loop as an input signal; and
   said phase shifting device connected between said oscillator and said phase-locked loop.

2. The clock signal generating device according to claim 1, wherein said phase shifting device is a delay element with an adjustable delay.

3. The clock signal generating device according to claim 1, wherein said phase shifting device is a voltage-controlled delay element.

4. A clock signal generating device, comprising:
   an oscillator for outputting a signal having edges;
   a phase-locked loop connected downstream from said oscillator;
   a phase shifting device for obtaining a resultant signal by temporally variably shifting the edges of the signal output by said oscillator;
   said phase shifting device configured for feeding the resultant signal to said phase-locked loop as an input signal;
   said phase shifting device connected between said oscillator and said phase-locked loop; and
   a memory device for storing control signals used to drive said phase shifting device.

5. The clock signal generating device according to claim 4, wherein said memory device is a nonvolatile memory device.

6. The clock signal generating device according to claim 5, comprising;
   a frequency divider for providing an output signal obtained by dividing a frequency of the signal output by said oscillator;
   an address generating device for addressing said memory device;
   said address generating device for generating an address used while taking account of the output signal of said frequency divider.

7. The clock signal generating device according to claim 6, comprising a D/A convertor for converting a control signal output by said memory device into an analog control signal being fed to said phase shifting device.

8. The clock signal generating device according to claim 4, comprising:
   a frequency divider for providing an output signal obtained by dividing a frequency of the signal output by said oscillator;
   an address generating device for addressing said memory device;
   said address generating device for generating an address used while taking account, of the output signal of said frequency divider.

9. The clock signal generating device according to claim 4, comprising a D/A converter for converting a control signal output by said memory device into an analog control signal being fed to said phase shifting device.

10. The clock signal generating device according to claim 1, wherein said phase shifting device is driven such that said phase-locked loop generates a clock signal with a varying frequency.

11. The clock signal generating device according to claim 1, wherein said phase shifting device is driven such that the clock signal generating device can be used as a spread spectrum oscillator.

12. The clock signal generating device according to claim 1, wherein said phase shifting device is driven to shift the edges of the signal output by said oscillator such that said phase shifting device outputs a clock signal with a frequency that is different than that of the signal output by said oscillator.

13. A spread spectrum oscillator, comprising:

an oscillator for outputting a signal having edges;

a phase-locked loop connected downstream from said oscillator;

a phase shifting device of or obtaining a resultant signal by temporally variably shifting the edges of the signal output by said oscillator;

said phase shifting device configured for feeding the resultant signal in simulated frequency variation form to said phase-locked loop as an input signal; and said phase shifting device connected between said oscillator and said phase-locked loop.

\* \* \* \* \*

UNITED STATES PATENT AND TRADEMARK OFFICE
CERTIFICATE OF CORRECTION

PATENT NO. : 6,798,303 B2
DATED : September 28, 2004
INVENTOR(S) : Thomas Steinecke et al.

It is certified that error appears in the above-identified patent and that said Letters Patent is hereby corrected as shown below:

Column 10,
Line 48, should read as follows:
-- used while taking account of the output signal of said --

Column 11,
Line 6, should read as follows:
-- a phase shifting device for obtaining a resultant signal --

Signed and Sealed this

Twenty-second Day of February, 2005

JON W. DUDAS
*Director of the United States Patent and Trademark Office*